(12) United States Patent
Cheng et al.

(10) Patent No.: US 11,637,238 B2
(45) Date of Patent: Apr. 25, 2023

(54) RESISTIVE RANDOM-ACCESS MEMORY CELL AND MANUFACTURING METHOD THEREOF

(71) Applicant: International Business Machines Corporation, Armonk, NY (US)

(72) Inventors: Kangguo Cheng, Schenectady, NY (US); Chanro Park, Clifton Park, NY (US); Juntao Li, Cohoes, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 132 days.

(21) Appl. No.: 17/169,614

(22) Filed: Feb. 8, 2021

(65) Prior Publication Data

US 2022/0254996 A1    Aug. 11, 2022

(51) Int. Cl.
*H10N 70/20*    (2023.01)
*H10B 63/00*    (2023.01)
(Continued)

(52) U.S. Cl.
CPC ........ *H01L 45/085* (2013.01); *H01L 27/2463* (2013.01); *H01L 45/1226* (2013.01);
(Continued)

(58) Field of Classification Search
CPC ............... H01L 45/085; H01L 27/2463; H01L 45/1226; H01L 45/1266; H01L 45/148; H01L 45/1658; H01L 45/1675
See application file for complete search history.

(56) References Cited

U.S. PATENT DOCUMENTS

| 7,666,526 B2 | 2/2010 | Chen |
| 8,154,915 B2 | 4/2012 | Yoshikawa |
| (Continued) | | |

FOREIGN PATENT DOCUMENTS

| EP | 2973772 B1 | 11/2017 |
| JP | 4599425 B2 | 12/2010 |

OTHER PUBLICATIONS

Choi et al., "SiGe epitaxial memory for neuromorphic computing with reproducible high performance based on engineered dislocations", Nature Materials, Apr. 2018, 7 pages, vol. 17, https://doi.org/10.1038/s41563-017-0001-5.
(Continued)

*Primary Examiner* — David Vu
(74) *Attorney, Agent, or Firm* — David K. Mattheis

(57) ABSTRACT

An resistive random-access memory (RRAM) device including an first crystalline semiconductor layer disposed adjacent to a crystalline semiconductor substrate, a crystal lattice edge-dislocation segment disposed at an interface of the first crystalline semiconductor layer and crystalline semiconductor substrate, the lattice edge-dislocation segment including first and second segment ends, a first ion-source electrode disposed upon the electrically isolating spacer, adjacent to the crystalline substrate and first crystalline semiconductor layer, and further disposed in contact with the first segment end of the lattice edge-dislocation segment, and a second electrode disposed upon the electrically isolating spacer, adjacent to the crystalline substrate and first crystalline semiconductor layer, and further disposed in contact with the second segment end of the lattice edge-dislocation segment.

10 Claims, 11 Drawing Sheets

(51) Int. Cl.
   *H01L 45/00* (2006.01)
   *H01L 27/24* (2006.01)
(52) U.S. Cl.
   CPC ........ *H01L 45/1266* (2013.01); *H01L 45/148* (2013.01); *H01L 45/1658* (2013.01); *H01L 45/1675* (2013.01)

(56) References Cited

U.S. PATENT DOCUMENTS

| | | | |
|---|---|---|---|
| 8,395,927 | B2 | 3/2013 | Kreupl |
| 9,318,702 | B2 | 4/2016 | Fest |
| 9,553,264 | B2 | 1/2017 | Collins |
| 9,831,426 | B2 | 11/2017 | Park |
| 10,043,972 | B2 | 8/2018 | Tseng |
| 2019/0198100 | A1 | 6/2019 | Pillarisetty |
| 2019/0305218 | A1 | 10/2019 | Trinh |
| 2020/0295172 | A1* | 9/2020 | Dasgupta ............ H01L 29/0847 |

OTHER PUBLICATIONS

Haddara et al., "Silicon-Germanium: Properties, Growth and Applications", Chapter 22, Springer Handbook of Electronic and Photonic Materials, © Springer International Publishing AG 2017, S. Kasap, P. Capper (Eds.), DOI 10.1007/978-3-319-48933-9_22, 19 pages.

Kamaladasa et al., "Dislocation impact on resistive switching in single-crystal SrTiO3", Journal of Applied Physics, Jun. 21, 2013, 8 pages, <https://www.researchgate.net/publication/257974902_Dislocation_impact_on_resistive_switching_in_single-crystal_SrTiO3>.

Sakai et al., "Pure-edge dislocation network for strain-relaxed SiGe/Si (001) systems", Applied Physics Letters 86, 221916 (2005), 4 pages.

Seung et al., "Flexible conductive-bridging random-access-memory cell vertically stacked with top Ag electrode, PEO, PVK, and bottom Pt electrode", Nanotechnology 25 (2014) 435204, Published Oct. 9, 2014, 8 pages, doi:10.1088/0957-4484/25/43/435204.

* cited by examiner

RESISTIVE RANDOM-ACCESS MEMORY CELL AND MANUFACTURING METHOD THEREOF

BACKGROUND

The disclosure relates generally to resistive random-access memory devices. The disclosure relates particularly to conductive-bridge resistive random-access memory cells and associated manufacturing methods.

Resistive random-access memory (RRAM), including conductive-bridge random-access memory (CBRAM), is a non-volatile memory structure in which the electrical resistance of a cell is different depending upon the last write operation applied to the cell. The resistance—and associated binary "1, or 0" state of the cell persists even after device power is removed.

CBRAM structures include one or more nano-scale filaments between two electrodes. Ion flow between the two electrodes when a voltage is applied occurs along the filaments, altering the resistance of the cell. The flow of ions from a first electrode to the second electrode under an applied voltage and the ion flow from the second electrode to the first electrode when the voltage has been reversed, have different magnitudes, resulting in directionally dependent device resistances. Crystal lattice differences between SiGe and Si may lead to the formation of regularly spaced edge-dislocation lattice defects at the interface between an Si substrate and a thin film of epitaxially grown SiGe as well as thread defects extending threading through the SiGe lattice from the SiGe/Si interface to the upper surface of the SiGe layer. Annealing the SiGe/Si structure alters the ratio of thread defects and edge-dislocation defects.

SUMMARY

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later.

Aspects of the invention include methods of forming a resistive random-access memory device by: growing a crystalline semiconductor layer including a first semiconductor material upon a crystalline semiconductor substrate including a second semiconductor material where the first semiconductor material differs from the second semiconductor material, depositing a hard mask material upon the crystalline semiconductor layer, selectively removing hard mask material, crystalline semiconductor layer and crystalline semiconductor substrate, yielding a stack including crystalline semiconductor substrate material, crystalline semiconductor layer, and hard mask material including an edge-dislocation segment disposed between the semiconductor substrate and the semiconductor layer, disposing an isolating layer upon the semiconductor substrate surrounding the stack, diffusing a conductive material along the edge-dislocation segment, and forming a first electrode and a second electrode upon the crystalline semiconductor substrate and in electrical contact with the edge-dislocation segment. The crystalline semiconductor layer includes periodically spaced edge-dislocations at the interface with the crystalline semiconductor substrate.

A resistive random-access-memory (RRAM) device structure including a first crystalline semiconductor layer disposed adjacent to a crystalline semiconductor substrate, an epitaxial layer crystal lattice edge-dislocation segment disposed at an interface of the epitaxial layer and crystalline semiconductor substrate, the lattice edge-dislocation segment including first and second segment ends, a first ion-source electrode disposed upon the electrically isolating spacer, adjacent to the crystalline substrate and epitaxial layer, and further disposed in contact with the first segment end of the lattice edge-dislocation segment, and a second electrode disposed upon the electrically isolating spacer, adjacent to the crystalline substrate and epitaxial layer, and further disposed in contact with the second segment end of the lattice edge-dislocation segment.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Figure 1:
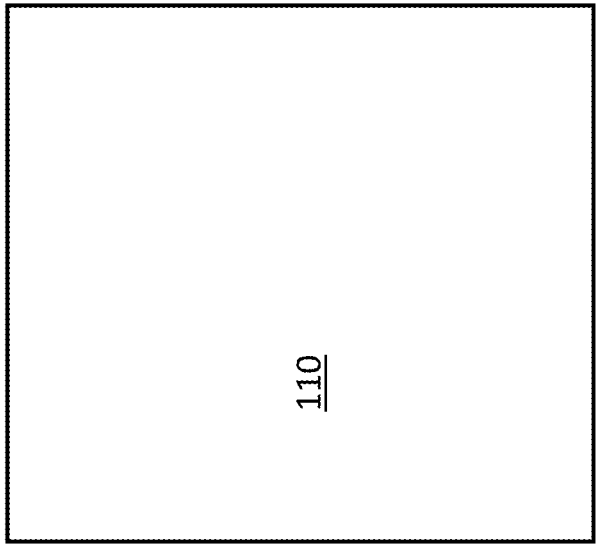
FIG. 1 provides cross-sectional side and top-down plan views of a step in the fabrication of a semiconductor device, according to an embodiment of the invention. The figure illustrates the device after formation of a crystalline semiconductor substrate.
Figure 1:
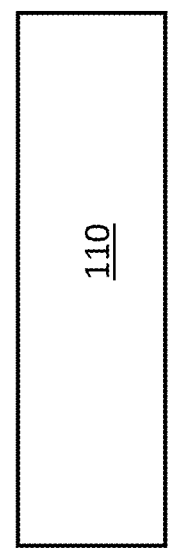

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language and stored in a computer storage medium (such as a disk, tape, physical hard drive, or virtual hard drive, such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below", or "beneath" other elements or features would then be oriented "above" the other elements or features. Thus, the term "below" can encompass both an orientation of above and below. The device can be otherwise oriented (rotated 90 degrees or at other orientations and the spatially relative descriptors used herein can be interpreted accordingly. In addition, be understood that when a layer is referred to as being "between" two layers, it can be the only layer between the two layers, or one or more intervening layers cat also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Throughout the following description of embodiments of the invention, reference is made to the accompanying figures in which common reference numbers across the set of figures refer to the same element of the illustrated devices.

RRAM, including CBRAM, may include thread filaments created during the formation of a crystalline semiconductor layer between an active ion source electrode and an inactive electrode. The thread filaments extend within the crystalline semiconductor layer between the interfaces with the two electrodes. As voltage is applied across the semiconductor layer with the active electrode as a positive terminal, ions flow from the active electrode along the thread filament toward the inactive electrode. The ions accumulate along the thread filament reducing the electrical resistance between the two electrodes. The location of the ions along the thread filament persists to a greater or lesser degree after the voltage is removed, retaining at least part of the change in electrical resistance. Reversing the voltage results in ion flow back to the active electrode, increasing the electrical resistance between the electrodes. Once again, the location of the ions persists after the removal of the voltage. The switchable, two-state nature of the RRAM structure provides non-volatile data storage capabilities with the two-resistance state representing digital "0" and "1" states which can be read by evaluating the resistance of the RRAM cell. Selective etching may be used to expand the thread filaments, increasing their stability. Lack of control regarding the number and location of thread filaments within the crystalline semiconductor layer during formation yields collections of RRAM cells having widely varying electrical characteristics. Disclosed methods and devices provide RRAM cells, including CBRAM cells, having conductive filaments disposed in pre-determined locations between electrodes and providing more consistent electrical switching properties.

In an embodiment, CBRAM cells include a segment of a crystal lattice edge-dislocation formed at the interface between semiconductor layers having mismatched lattice structures. In this embodiment, a semiconductor layer formed adjacent to a semiconductor substrate, results in periodically spaced edge-dislocations at the interface between the two layers. In an embodiment, manipulation and control of the spacing of the edge-dislocations involves altering the composition of the semiconductor layer, the thickness of the semiconductor layer and the application of external forces (post-deposition or high temperature annealing of the semiconductor layer crystal lattice). The use of nano-scale optical or electron microscopy enables the acquisition of images of the formed edge-dislocations. Analysis of the images reveals the location, orientation, and spacing of the edge-dislocations.

In an embodiment, after formation of a protective hard mask layer, CBRAM cell lithographic masks, registered and aligned with located edge-dislocations, enable the creation of arrays of discrete CBRAM cell stacks including a base semiconductor substrate, a semiconductor layer formed upon the substrate and the protective hard mask layer upon the semiconductor layer. Each stack including a single edge-dislocation segment at the interface between a semiconductor layer and a semiconductor substrate, the edge-dislocation segment extending across the stack. In an embodiment, creation of the stacks exposes the ends of the edge-dislocation segments at the sides of the CBRAM stacks.

After formation of the CBRAM stacks patterned etching, formation of a protective dielectric layer, such as silicon oxide, silicon nitride, silicon oxynitride, or any combination of those materials, occurs. Chemical-mechanical planarization (CMP) process then smooth and polish the combination of CBRAM cell upper hard mask layer and protective dielectric layer.

In an embodiment, each CBRAM cell requires two electrodes. In this embodiment, the two electrodes are formed from dissimilar conductive materials. In an embodiment, the material of one electrode includes an ion source material and the material of the other electrode does not. The dissimilarity of the two electrode materials yield a CBRAM cell having the possibility of two distinct electrical resistance states. Each state associated with the polarity of a voltage applied to the cell. Voltage application where the ion donor electrode is positive yields a low resistance state as ions migrate along the edge-dislocation segment disposed between the electrodes. Reversing the polarity of the applied voltage yields the high resistance state as the ions migrate back to the ion donor electrode and fewer ions migrate along the edge-dislocation segment from the non-ion-donor electrode.

In an embodiment, formation of the electrodes includes the successive formation of first electrode trenches in the protective dielectric layer. The trenches are patterned and etched in the protective dielectric layer, leaving a protective dielectric spacer between the bottom of the trench and the semiconductor substrate. The trenches expose an end of the edge-dislocation segment of each cell. In this embodiment, deposition of first electrode ion-donor conductive material in the trenches completes the formation of first electrodes.

After formation of the first electrode, additional patterned etching creates second electrode trenches. Second electrode trenches formed through the protective dielectric layer, leaving a protective dielectric spacer between the bottom of the second electrode trench and the underlying semiconductor substrate. The second electrode trenches expose the other end of the CBRAM edge-dislocation segment. In this embodiment, deposition of second electrode non-ion-donor conductive material in the trenches completes the formation of second electrodes.

In an embodiment, after the formation of either the first electrode trenches or the second electrode trenches, but prior to the formation of the associated electrodes, deposition of a low reactivity conductive material along the length of the edge-dislocation segments of the CBRAM cells occurs, forming a conductive filament. In an embodiment, the conductive filament includes a third conductive material. In this embodiment, deposition of low reactivity conductive materials, such as Ag, Au Pt, Os, or Pd, provides enhanced chemical stability to the edge-dislocation compared to a relatively higher reactivity material such as Cu, which may be used as the ion-donor first electrode. Reducing the reactivity of the edge-dislocation filament ions prolongs the useful life of the CBRAM cell by increasing the number of write cycles the CBRAM cell undergoes before degrading in performance due to conductive ion reactions along the conductive filament. The third conductive material is dissimilar to the materials of at least one of the first and second electrodes.

Further reference is now made to the figures. The figures provide schematic cross-sectional illustration of semiconductor devices at intermediate stages of fabrication, according to one or more embodiments of the invention. The figures provide a plan view (right) and a side cross-section (left) taken along section line x-x of the plan view. The figures provide schematic representations of the devices of the invention and are not to be considered accurate or limiting with regards to device element scale.

As shown in FIG. 1, formation of the CBRAM devices 100 begins with the formation of an underlying semiconductor substrate 110 or substrate 110 on oxide (not shown). The semiconductor substrate 110 may include any semiconductor material including, for example, silicon. The term "semiconductor material" is used throughout the present application to denote a material that has semiconducting properties. Besides silicon, the semiconductor material may be strained Si, silicon carbide (SiC), germanium (Ge), silicon germanium (SiGe), silicon-germanium-carbon (SiGeC), Si alloys, Ge alloys, III-V semiconductor materials (e.g., gallium arsenide (GaAs), indium arsenide (InAs), indium phosphide (InP), or aluminum arsenide (AlAs)), II-VI materials (e.g., cadmium selenide (CaSe), cadmium sulfide (CaS), cadmium telluride (CaTe), zinc oxide (ZnO), zinc selenide (ZnSe), zinc sulfide (ZnS), or zinc telluride (ZnTe), or any combination thereof. By "III-V semiconductor material" it is meant that the semiconductor material includes at least one element from Group IIIA (i.e., Group 13) of the Periodic Table of Elements and at least one element from Group VA (i.e., Group 15) of the Periodic Table of Elements.

Figure 2:
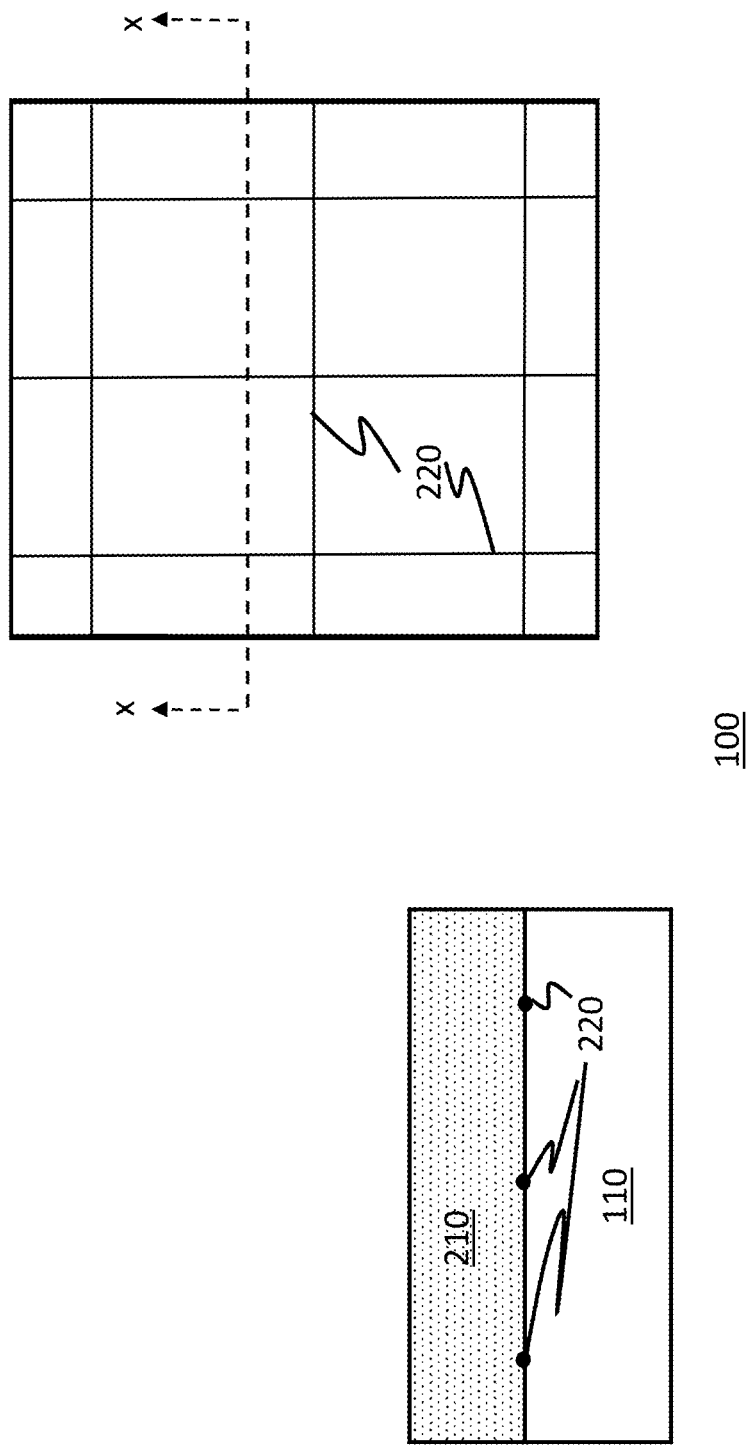
FIG. 2 provides cross-sectional side and top-down plan views of a step in the fabrication of a semiconductor device, according to an embodiment of the invention. The figure illustrates the device after formation of a crystalline semiconductor layer upon the crystalline semiconductor substrate.

FIG. 2 illustrates device 100 after the formation of semiconductor layer 210 having a crystalline lattice structure which differs or is mismatched with the lattice structure of semiconductor substrate 110. In an embodiment, semiconductor layer 210 includes a SiGe crystal lattice. In this embodiment, semiconductor layer 210 includes between about 20% and about 95% Ge. In this embodiment, semiconductor layer has a thickness of between about 10 nm and about 500 nm. In an embodiment, increasing either the Ge concentration, the layer thickness, or both increases the spacing between the interfacial edge-dislocations 220 at the semiconductor layer 210—semiconductor substrate 110 interface. For example, a concentration of 20% Ge, and a layer thickness of 100 nm SiGe may cause a dislocation spacing of approximately 100 nm As an example for this description, and without limiting the disclosed embodiments of the invention, the device will be described using the example of SiGe/Si, or a SiGe layer formed upon an Si substrate.

In an embodiment, thermal annealing the SiGe/Si structure extends the edge-dislocations 220 along the SiGe—Si interface and, at sufficiently high annealing temperatures for 10 seconds to 30 minutes, increases the density of edge-dislocations. In an embodiment, the thermal annealing occurs at about 250 C. In an embodiment, the thermal annealing occurs at between about 600 C and about 1000 C.

Nano-scale images of the formed SiGe/Si structure reveal the locations and orientation of the periodically spaced edge-dislocations 220. Analysis of the images enables the positioning of lithographic masks in registration with the location and orientation of the edge-dislocations 220. Prior to the patterned lithography and associated removal of material using a wet or dry etch process, deposition of a protective hard mask layer 310 occurs upon SiGe layer 210.

Hard mask layer 310 includes a nitride, oxide, an oxide-nitride bilayer, or another suitable material. In some embodiments, the hard mask layer 310 may include an oxide such as silicon oxide (SiO), a nitride such as silicon nitride (SiN), an oxynitride such as silicon oxynitride (SiON), combinations thereof, etc. In some embodiments, the hard mask layer 310 is a silicon nitride.

Figure 3:
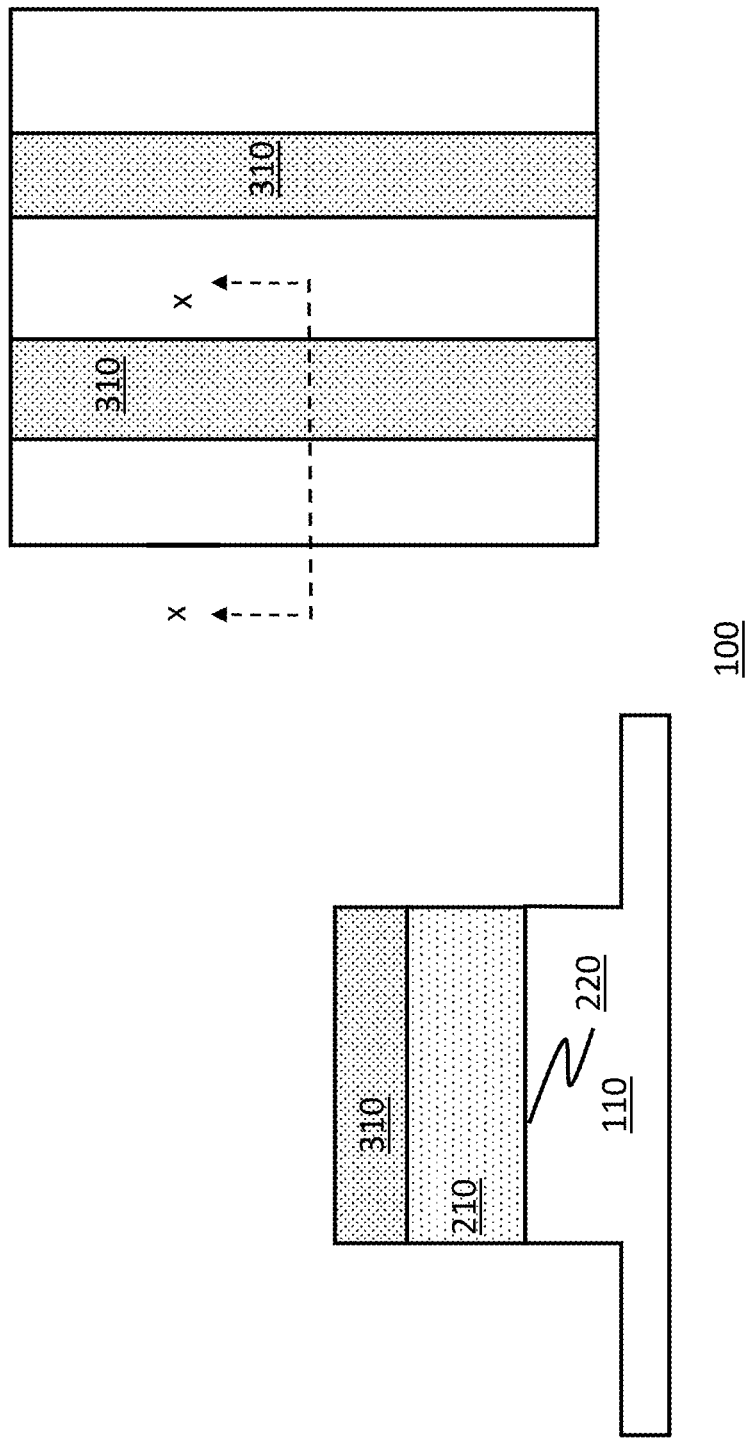
FIG. 3 provides cross-sectional side and top-down plan views of a step in the fabrication of a semiconductor device, according to an embodiment of the invention. The figure illustrates the device after a first step in selectively etching CBRAM cells.
Figure 4:
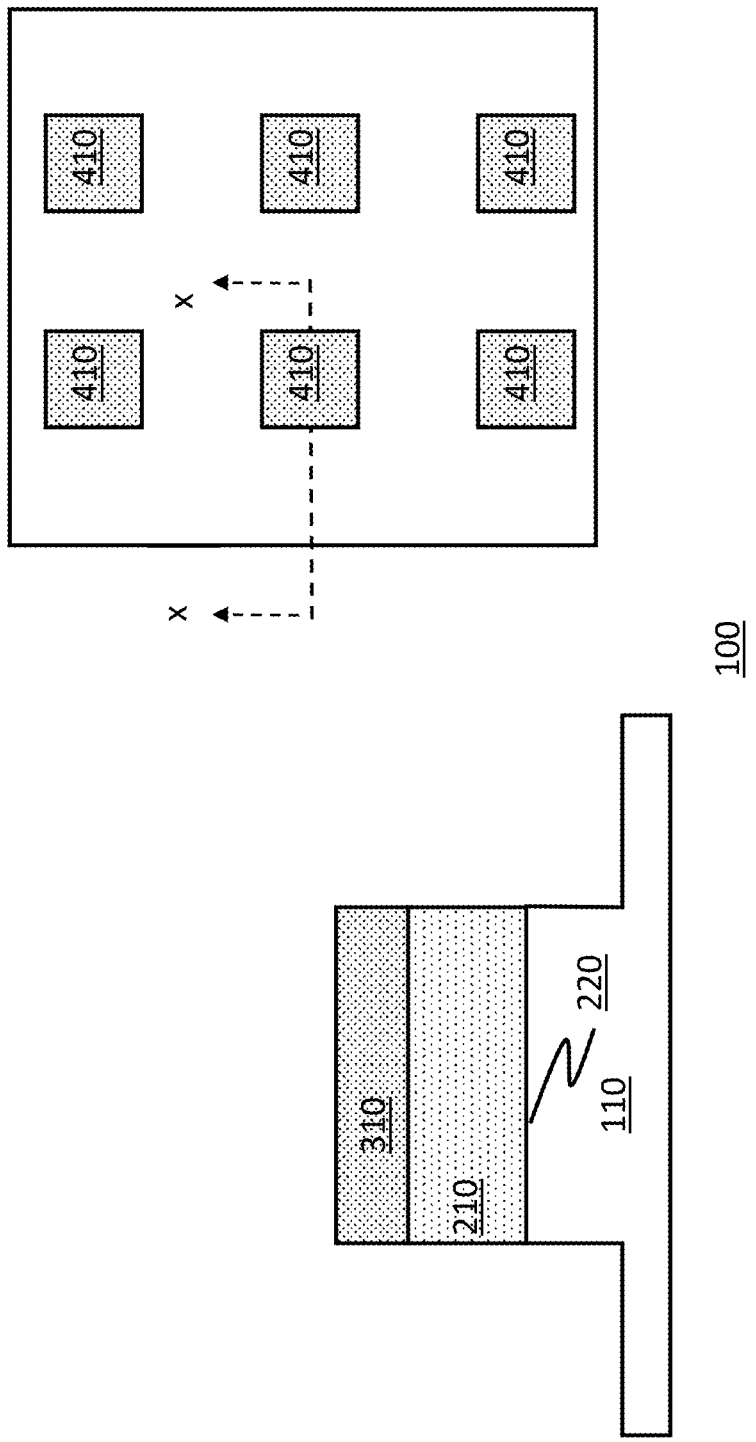
FIG. 4 provides cross-sectional side and top-down plan views of a step in the fabrication of a semiconductor device, according to an embodiment of the invention. The figure illustrates the device after a second step in selectively etching CBRAM cells.

Positioning the lithographic mask enables the creation of individual discrete CBRAM cell stacks, each including a single edge-dislocation segment aligned with the geometry of the CBRAM cell stack. As illustrated in FIG. 3, initial etching results in straps of hard mask layer 310, covering multiple edge-dislocation segments, further masking and etching in view of the determined locations of the edge-dislocations from the images, results in the discrete CBRAM cells 410, shown in FIG. 4.

Figure 5:
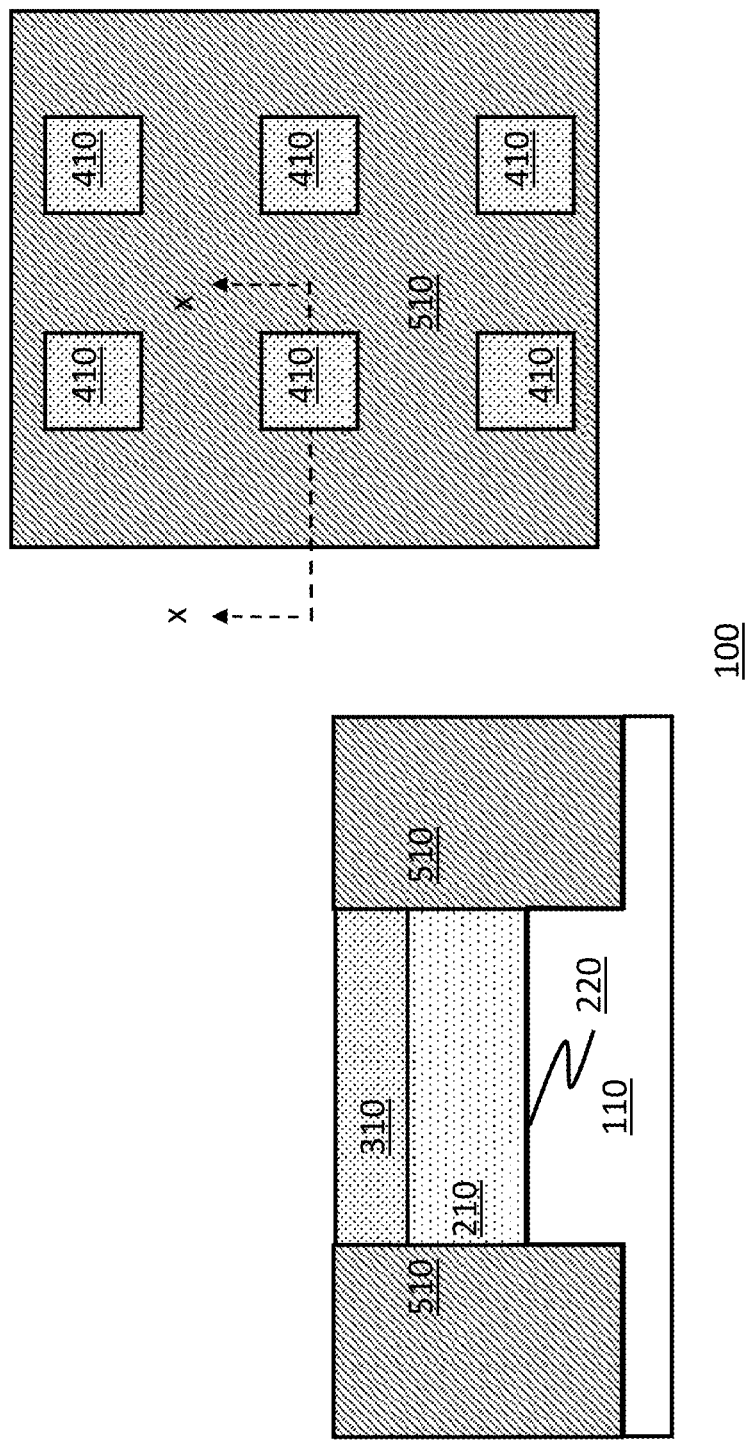
FIG. 5 provides cross-sectional side and top-down plan views of a step in the fabrication of a semiconductor device, according to an embodiment of the invention. The figure illustrates the device after deposition of a protective layer around the CBRAM cells.

FIG. 5 illustrates device 100, subsequent to the formation of discrete CBRAM cells 410, formation of a protective dielectric layer 510, such as silicon oxide, silicon nitride, silicon oxynitride, or any suitable combination of those materials, deposited by chemical vapor deposition (CVD), physical vapor deposition (PVD), or any suitable methods occurs. CMP process smooth and polish the common surface of hard mask layer 310 and protective dielectric layer 510. In one embodiment, the protective dielectric layer is silicon oxide.

Figure 6:
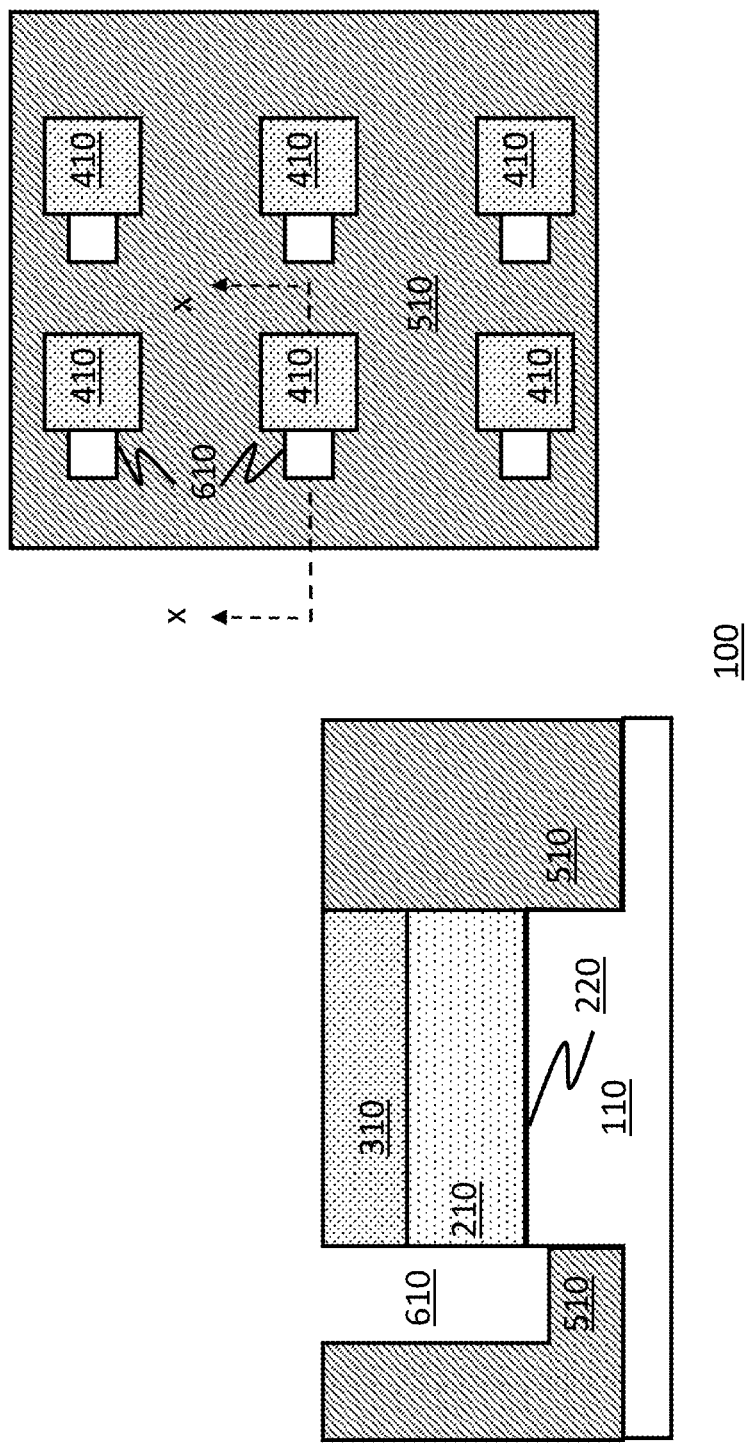
FIG. 6 provides cross-sectional side and top-down plan views of a step in the fabrication of a semiconductor device, according to an embodiment of the invention. The figure illustrates the device after patterned formation of a first set of CBRAM electrode trenches.

FIG. 6 illustrate device 100 after selectively etching trenches for a first set of CBRAM electrodes. As shown in the figure, each trench passes through a portion of protective layer. In an embodiment (not shown), etching proceeds through protective dielectric layer 510, exposing semiconductor substrate 110. In an embodiment, etching the trench stops before reaching the semiconductor substrate 110, leaving a bottom spacer of protective dielectric layer 510 between the bottom of trench 610 and semiconductor substrate 110. Trench 610 exposes an end of a segment of edge-dislocations 220.

Figure 7:
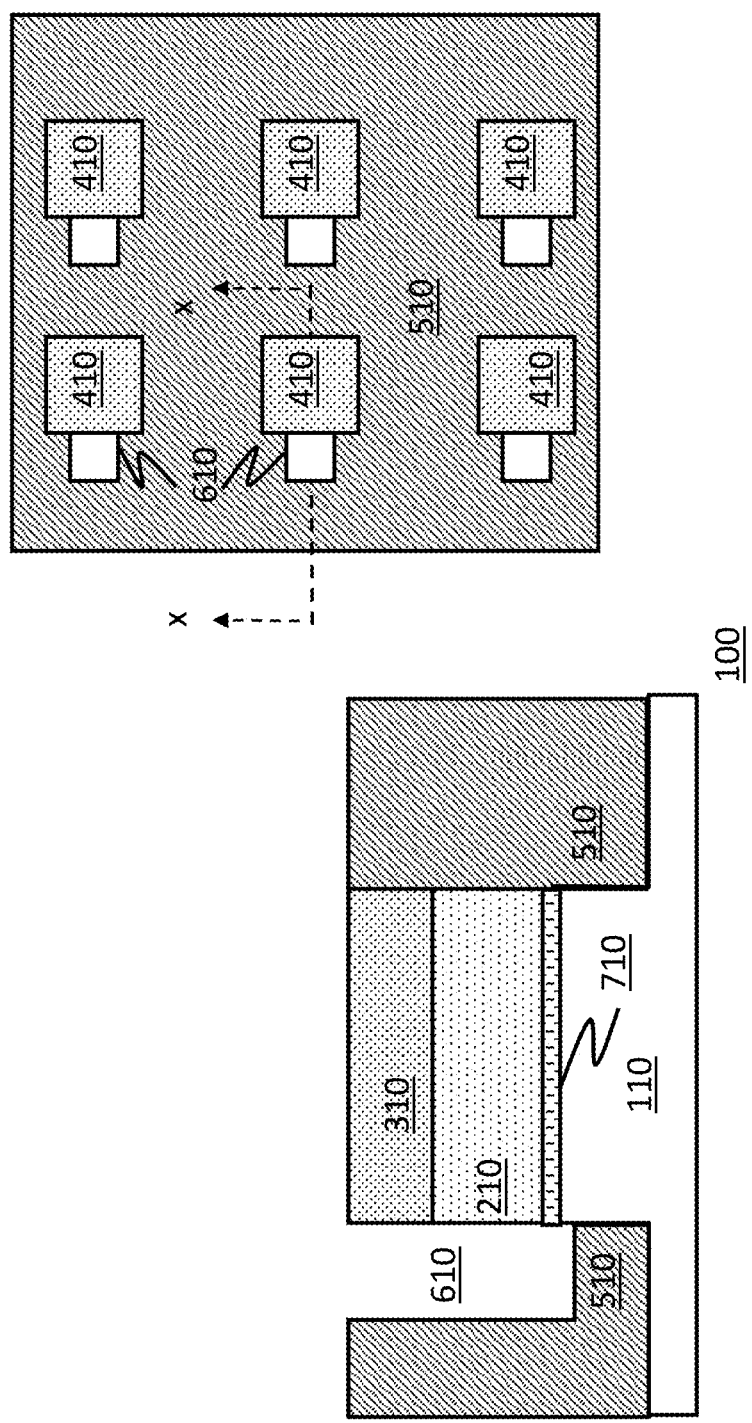
FIG. 7 provides cross-sectional side and top-down plan views of a step in the fabrication of a semiconductor device, according to an embodiment of the invention. The figure illustrates the device after formation of CBRAM cell conductive filaments along interface edge-dislocations.

FIG. 7 illustrates device 100 after formation of conductive filament 710 by diffusing a conductive material, such as Ag, Au, Pt, Os, or Pd, along the segment of edge-dislocations 220, from the end of the segment exposed by the trench 610.

Figure 8:
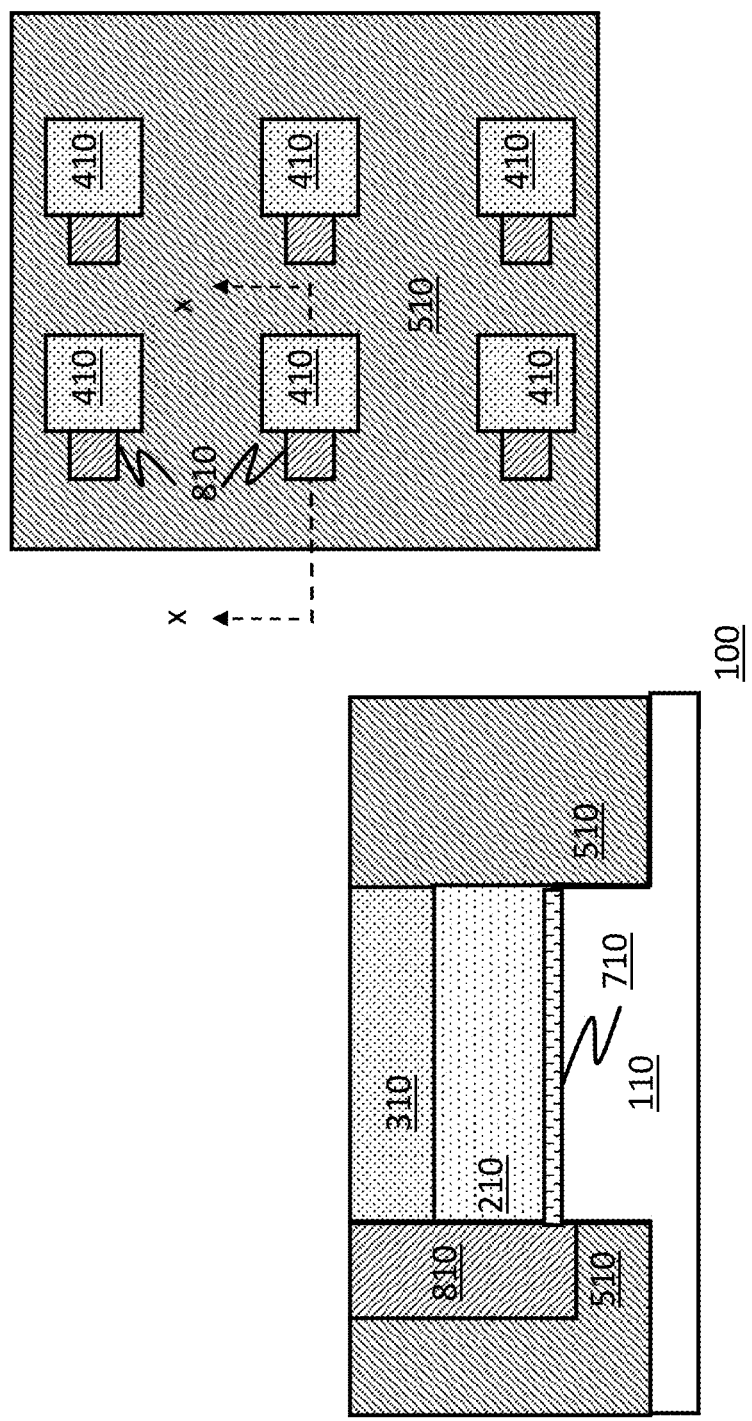
FIG. 8 provides cross-sectional side and top-down plan views of a step in the fabrication of a semiconductor device, according to an embodiment of the invention. The figure illustrates the device after formation of a first set of CBRAM electrodes at one end of a CBRAM cell conductive filament.

FIG. 8 illustrates device 100 after deposition of first electrode 810 material in trench 610. In an embodiment, first electrode 810 material includes an ion-source, or ion-donor, material such as Cu, Ag, Au or similar materials. Deposition of first electrode 810 material occurs using CVD, atomic layer deposition (ALD), PVD, or similar material deposition methods. CMP processes trim back the first electrode 810 material to the upper surface of hard mask layer 310, and protective dielectric layer 510.

Figure 9:
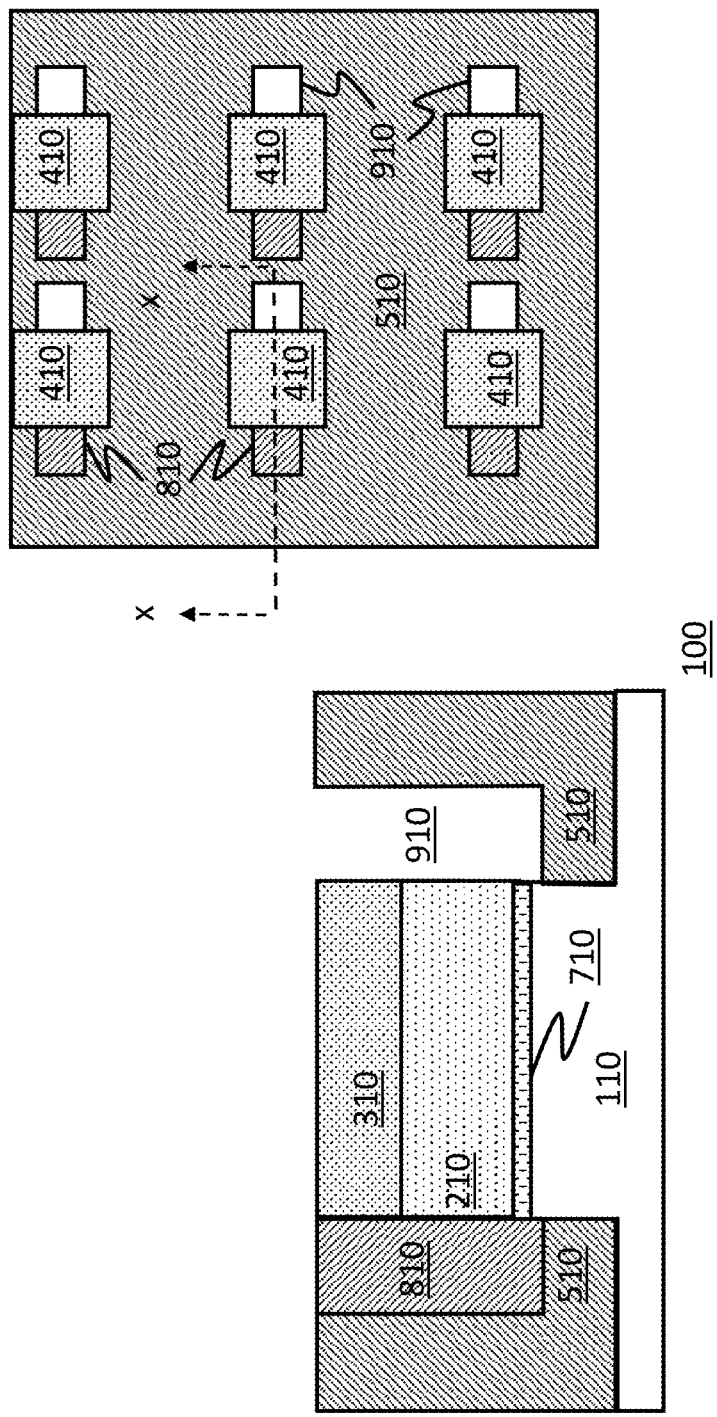
FIG. 9 provides cross-sectional side and top-down plan views of a step in the fabrication of a semiconductor device, according to an embodiment of the invention. The figure illustrates the device after patterned formation of a second set of CBRAM electrode trenches.

FIG. 9 illustrates device 100 after selectively etching trenches 910 for a second set of CBRAM electrodes. As shown in the figure, each trench passes through a portion of protective dielectric layer 510. In an embodiment (not shown), etching proceeds through protective dielectric layer 510, exposing semiconductor substrate 110. In an embodiment, etching the trench 910 stops before reaching the semiconductor substrate 110, leaving a bottom spacer of protective dielectric layer 510 between the bottom of trench 910 and semiconductor substrate 110. Trench 910 exposes an end of a segment of edge-dislocation 220, or when one has been formed, conductive filament 710.

In an embodiment, the formation of a conductive filament 710 by diffusing a conductive material, such as Ag, Au, Pt, Os, or Pd, along the segment of edge-dislocations 220, from the end of the segment exposed by the trench 910 occurs after the formation of trench 910 rather than after the formation of trench 610.

Figure 10:
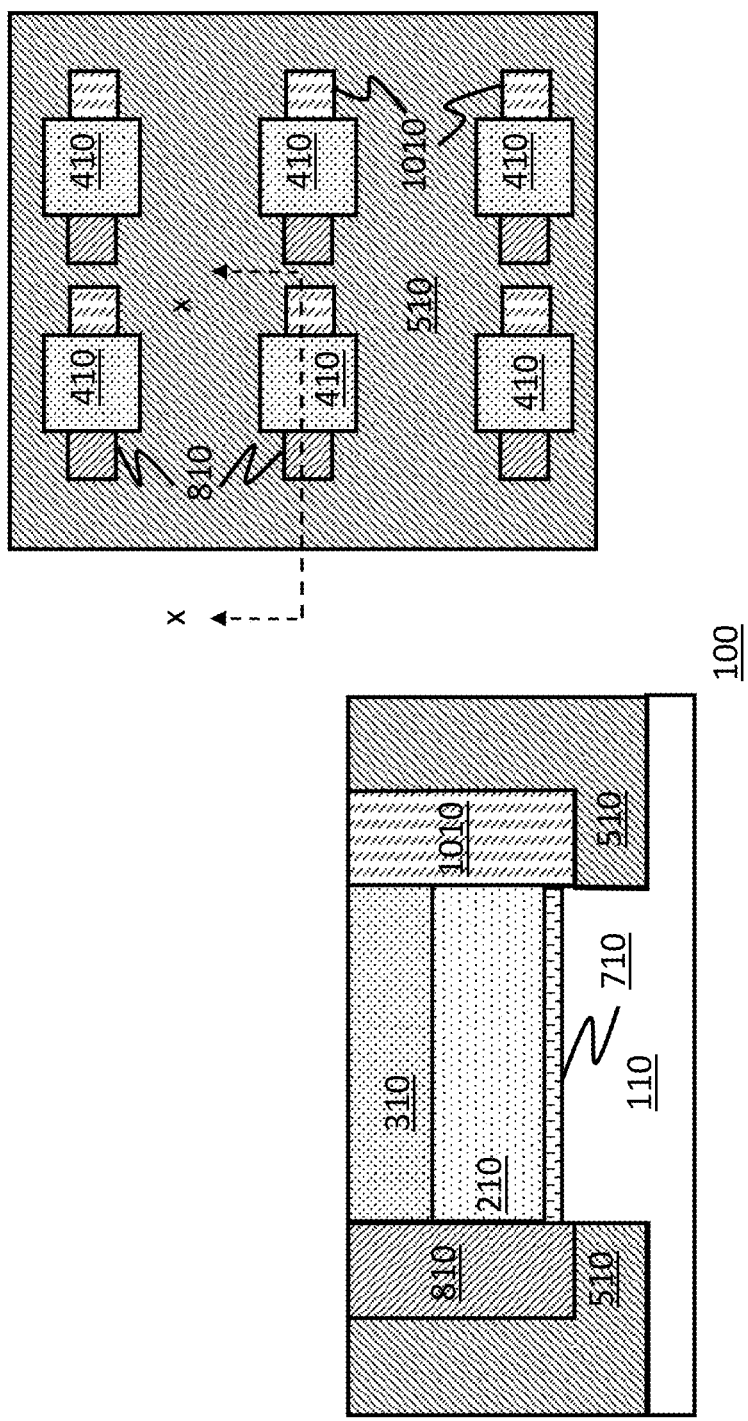
FIG. 10 provides cross-sectional side and top-down plan views of a step in the fabrication of a semiconductor device, according to an embodiment of the invention. The figure illustrates the device after formation of CBRAM cell electrode at the opposite end of the CBRAM cell conductive filament.

FIG. 10 illustrates device 100 after deposition of second electrode 1010 material in trench 910. In an embodiment, second electrode 1010 material includes a non-ion-source, or non-ion-donor, material such as W or similar materials. Deposition of second electrode 1010 material occurs using CVD, ALD, PVD, or similar material deposition methods. CMP processes trim back the second electrode 1010 material to the upper surface of hard mask layer 310, and protective dielectric layer 510.

Figure 11:
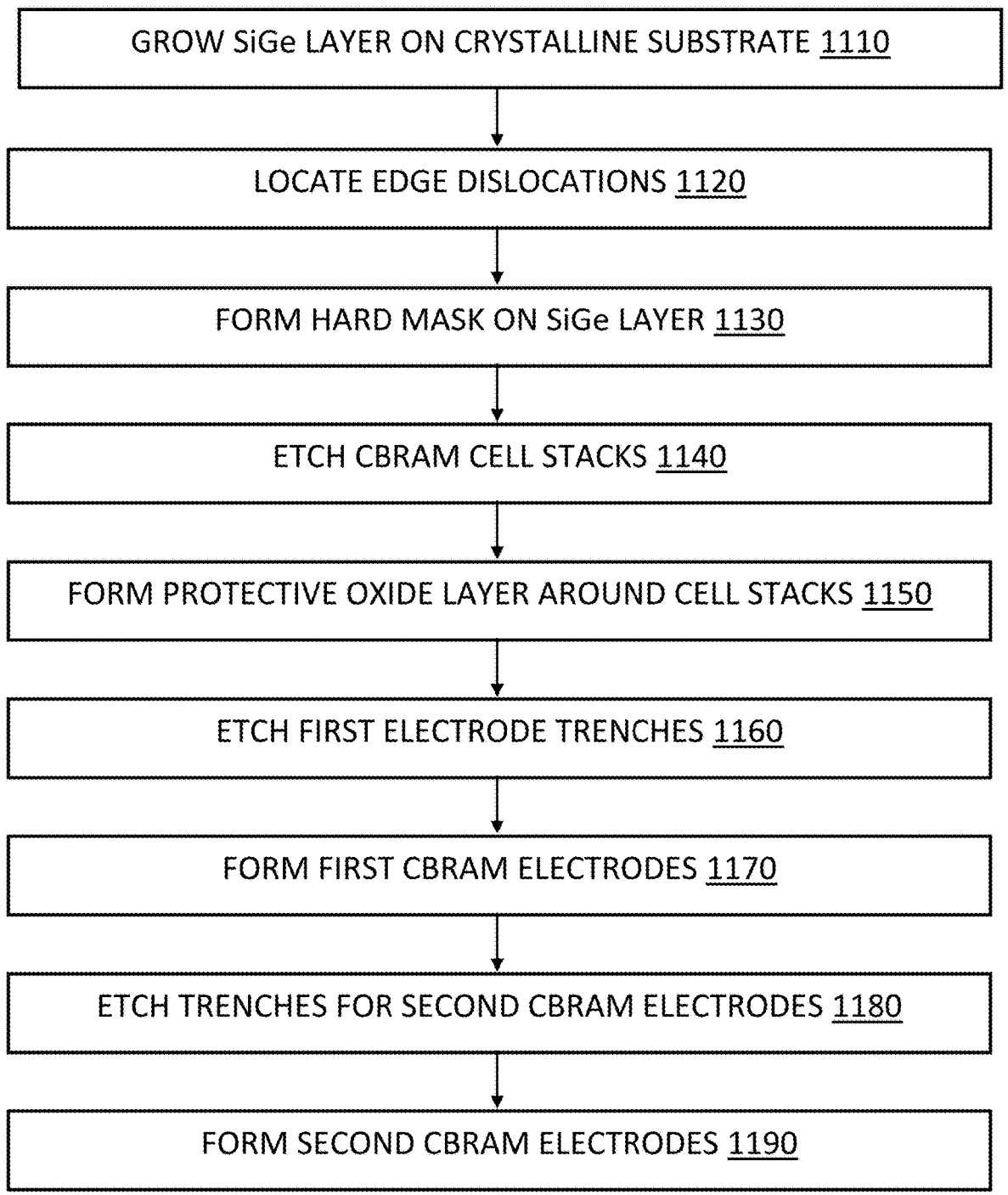
FIG. 11 provides a flowchart depicting operational steps for forming semiconductor device, according to an embodiment of the invention.

Flowchart 1100 of FIG. 11 sets forth operational steps for the fabrication of semiconductor CBRAM devices according to an embodiment of the invention. At block 1110, a crystalline SiGe layer is epitaxially grown upon an underlying crystalline Si substrate. The substrate may be horizontal or vertical. The SiGe layer includes a Ge concentration of between about 20% and about 100%. The SiGe layer is between about 10 nm and about 500 nm in thickness. The mismatch between the SiGe crystal lattice and that of the underlying Si substrate results in periodically spaced edge-dislocations in the SiGe layer.

At block 1120, analysis of device images determines the spacing, location, and orientations of the SiGe layer edge-dislocations. Location spacing and orientation of the edge-dislocation provides input to the correct placement of lithographic masks for patterned etching of CBRAM cells.

Prior to locating lithographic masks for etching the CBRAM cells, at block 1130 formation of a hard mask layer upon the SiGe layer occurs. The hard mask layer protects the SiGe during the CBRAM etching process.

At block 1140, the lithographic mask is placed in registration with the located edge-dislocations and used for the patterned masking and subsequent etching of hard mask, SiGe, and Si layers to form an array of CBRAM cell stacks, each stack including a single edge-dislocation segment aligned with the geometry of the CBRAM cell stack.

Deposition of a protective dielectric layer over the exposed substrate and around the etched CBRAM cell stacks, to the top of the hard mask occurs at block 1150, including subsequent CMP trimming smoothing and polishing of the protective dielectric and hard mask layers to a co-planar surface.

At block 1160, selective etching creates trenches for a first set of CBRAM electrodes. The trenches reveal the hard mask, SiGe and portions of the Si layers of the CBRAM cell stacks. The trenches reveal one end of the edge-dislocation segment of each CBRAM cell stack.

At block 1170, deposition of conductive ion-source material in the trenches followed by CMP process to trim and smooth the upper surface of the material completes the formation of the set of first CBRAM electrodes in contact with the edge-dislocation segments of each CBRAM cell.

At block 1180, selective etching creates trenches for a second set of CBRAM electrodes. the trenches reveal the hard mask, SiGe and portions of the Si layers of the CBRAM cell stacks. The trenches reveal the opposite end of the edge-dislocation segment of each CBRAM cell stack.

At block 1190, deposition of conductive non-ion-source material in the trenches followed by CMP process to trim and smooth the upper surface of the material completes the formation of the set of second CBRAM electrodes in contact with the edge-dislocation segments of each CBRAM cell.

In an embodiment, during an optional step prior to the deposition of either the first or second set of CBRAM electrodes, formation of a conductive filament along the edge-dislocation segment occurs by the diffusion of conductive ions along the edge-dislocation. In this embodiment, the conductive ions are dissimilar to the materials of either of the first and second CBRAM electrodes. In this embodiment, diffusion of low reactivity metals, such as Pt, Pd, Os, Ag, and Au along the edge-dislocation provides a more chemically stable conductive filament for the CBRAM, increasing the service life of the CBRAM cell.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

The flowchart and block diagrams in the figures illustrate the architecture, functionality, and operation of possible implementations of systems, methods, and device fabrication steps according to various embodiments of the present invention. In this regard, each block in the flowchart or block diagrams may represent a module, segment, or portion of instructions, which comprises one or more fabrication steps for manufacturing the specified device(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A resistive random-access memory (RRAM) device comprising:
   a first crystalline semiconductor layer disposed adjacent to a crystalline semiconductor substrate;
   a crystal lattice edge-dislocation disposed at an interface of the first crystalline semiconductor layer and the crystalline semiconductor substrate;

a first electrode disposed adjacent to the crystalline substrate and the first crystalline semiconductor layer, and further disposed in contact with a first end of the lattice edge-dislocation; and a second electrode disposed adjacent to the crystalline substrate and the first crystalline semiconductor layer, and further disposed in contact with a second end of the lattice edge-dislocation.

2. The RRAM device according to claim 1, wherein the first crystalline semiconductor layer comprises an SiGe layer.

3. The RRAM device according to claim 2, wherein the SiGe layer comprises about 25% to 95% germanium.

4. The RRAM device according to claim 1, further comprising a protective dielectric disposed between the crystalline semiconductor substrate and at least one of the first and second electrodes.

5. The RRAM device according to claim 1, further comprising:

a conductive filament disposed along the crystal lattice edge-dislocation, the conductive filament comprising first and second filament ends.

6. The RRAM device according to claim 5, wherein the conductive filament comprises silver or gold ions.

7. The RRAM device according to claim 1, wherein the first electrode comprises an ion source material.

8. The RRAM device according to claim 1, wherein the second electrode comprises tungsten.

9. The RRAM device according to claim 1, further comprising an array of RRAM cells.

10. The RRAM device according to claim 1, wherein the first crystalline semiconductor layer comprises a thickness of at least about 10 nm.

* * * * *